United States Patent
Kawasaki et al.

(10) Patent No.: US 6,782,907 B2
(45) Date of Patent: Aug. 31, 2004

(54) GAS RECIRCULATION FLOW CONTROL METHOD AND APPARATUS FOR USE IN VACUUM SYSTEM

(75) Inventors: Hiroyuki Kawasaki, Tokyo (JP); Tokuhisa Ohiwa, Kanagawa (JP); Itsuko Sakai, Kanagawa (JP)

(73) Assignees: Ebara Corporation, Tokyo (JP); Kabushiki Kaisha Toshiba, Tokyo (JP)

(*) Notice: Subject to any disclaimer, the term of this patent is extended or adjusted under 35 U.S.C. 154(b) by 266 days.

(21) Appl. No.: 10/101,923

(22) Filed: Mar. 21, 2002

(65) Prior Publication Data

US 2002/0134439 A1 Sep. 26, 2002

(30) Foreign Application Priority Data

Mar. 22, 2001 (JP) .......................... 2001-082841

(51) Int. Cl.[7] .......................... F17D 1/04; H01L 21/00
(52) U.S. Cl. .......................... 137/12; 137/14; 137/563; 137/565.23; 118/715; 438/909
(58) Field of Search .......................... 137/12, 14, 563, 137/565.23, 565.3; 118/715; 438/909

(56) References Cited

U.S. PATENT DOCUMENTS

| | | | | |
|---|---|---|---|---|
| 3,537,474 A | * | 11/1970 | Rohrer | 137/565.23 |
| 4,699,570 A | * | 10/1987 | Bohn | 417/6 |
| 4,728,869 A | | 3/1988 | Johnson et al. | |
| 4,762,531 A | * | 8/1988 | Kischel et al. | 137/563 |
| 5,433,238 A | * | 7/1995 | Cannizzaro et al. | 137/14 |
| 5,944,049 A | * | 8/1999 | Beyer et al. | 137/14 |
| 6,200,107 B1 | * | 3/2001 | Brewster | 417/251 |
| 6,217,633 B1 | * | 4/2001 | Ohmi et al. | 95/8 |
| 6,446,651 B1 | * | 9/2002 | Abbel | 137/565.23 |
| 2001/0051232 A1 | | 12/2001 | Sakai et al. | |

FOREIGN PATENT DOCUMENTS

| | | |
|---|---|---|
| JP | 59-64516 | 4/1984 |
| JP | 9-251981 | 9/1997 |
| JP | 0 983 791 | 3/2000 |

OTHER PUBLICATIONS

Patent Abstracts of Japan, entitled "Vacuum Exhauster", vol. 1998, No. 10, Aug. 31, 1998 & JP 10 125657 A (Ebara Corp), May 15, 1998.

Patent Abstracts of Japan, entitled "Semiconductor Manufacturing Equipment", vol. 1998, No. 01, Jan. 30, 1998 & JP 09 251981 A (Toshiba Corp.), Sep. 22, 1997.

(List continued on next page.)

*Primary Examiner*—John Rivell
(74) *Attorney, Agent, or Firm*—Wenderoth, Lind & Ponack L.L.P.

(57) ABSTRACT

A gas recirculation flow control method and apparatus for use in an evacuation system having a vacuum chamber into which a gas is introduced, a first vacuum pump for exhausting the gas from the vacuum chamber and reducing the pressure in the vacuum chamber to a desired pressure, a second vacuum pump for performing evacuation to lower the back pressure of the first vacuum pump below an allowable back pressure, and a gas recirculation line for returning a part of gas exhausted from the first vacuum pump to the vacuum chamber. The recirculation flow rate $Q_2$ of the gas returning to the vacuum chamber through the gas recirculation line is controlled by adjusting the differential pressure $Pd-Pc$ in the gas recirculation line by varying the effective pumping speed of the second vacuum pump using the following relationship:

$$Q_2 = C \times (Pd - Pc)$$

where: $Q_2$ denotes the recirculation flow rate of the gas returning to the vacuum chamber through the gas recirculation line; $Pc$ denotes the pressure in the vacuum chamber; $Pd$ denotes the pressure in the upstream side of the gas recirculation line; and $C$ denotes the conductance of the gas recirculation line.

16 Claims, 4 Drawing Sheets

OTHER PUBLICATIONS

Patent Abstracts of Japan, entitled "Forming Device for Metallic Partial Film and its Formation", vol. 1996, No. 06, Jun. 28, 1996, & JP 08 041626 A (Vacuum Metallurgical Co., Ltd.), Feb. 13, 1996.

U.S. Patent Application Ser. No. 09/686,370, entitled "Processing Apparatus".

U.S. Patent Application Ser. No. 09/955,083, entitled "Semiconductor Processing Apparatus and Method for Manufacturing a Semiconductor Device".

* cited by examiner

PRIOR ART

| | NO RECIRCULATION GATE VALVE (9) CLOOSED Q=Qt | | UNDER RECIRCULATION (RECIRCULATION RATIO:80%) GATE VALVE (9) OPEN Q=Q1 | |
|---|---|---|---|---|
| Qt (sccm) | Pd (Torr) | | Q1 (sccm) | Pd (Torr) |
| 250 | 0.26 | | 50 | 2.5 |
| 500 | 0.36 | | 100 | 3.8 |
| 750 | 0.45 | | 150 | 4.7 |

GAS RECIRCULATION FLOW CONTROL METHOD AND APPARATUS FOR USE IN VACUUM SYSTEM

BACKGROUND OF THE INVENTION

The present invention relates to a gas recirculation flow control method and apparatus for use in an evacuation system for introducing a process gas into a vacuum chamber of semiconductor manufacturing equipment or the like and exhausting the process gas from the vacuum chamber. The gas recirculation flow control method and apparatus control the recirculation flow rate of the gas exhausted from the vacuum chamber and returned thereto through a gas recirculation line.

In semiconductor manufacturing equipment for etching, CVD process, etc., a gas is introduced into a vacuum chamber, and the gas is exhausted by reducing the pressure in the vacuum chamber to a desired pressure with a vacuum pump. With the increase in diameter of semiconductor wafers, the amount of gas used in such semiconductor manufacturing equipment is increasing. In this regard, only a part of the gas introduced into the vacuum chamber contributes to the desired reaction. The rest of the gas, which accounts for a greater part of the introduced gas, is exhausted as it is without reacting. Under these circumstances, a gas recirculation process wherein a part of gas exhausted from the vacuum chamber is returned to the vacuum chamber is carried out for the purpose of increasing the utilization efficiency of the unreacted gas. The flow rate of the gas recirculating in the gas recirculation process (i.e. recirculation ratio) is controlled by directly measuring the flow rate of the gas passing through a gas recirculation line using a mass flow controller or the like.

Figure 1:
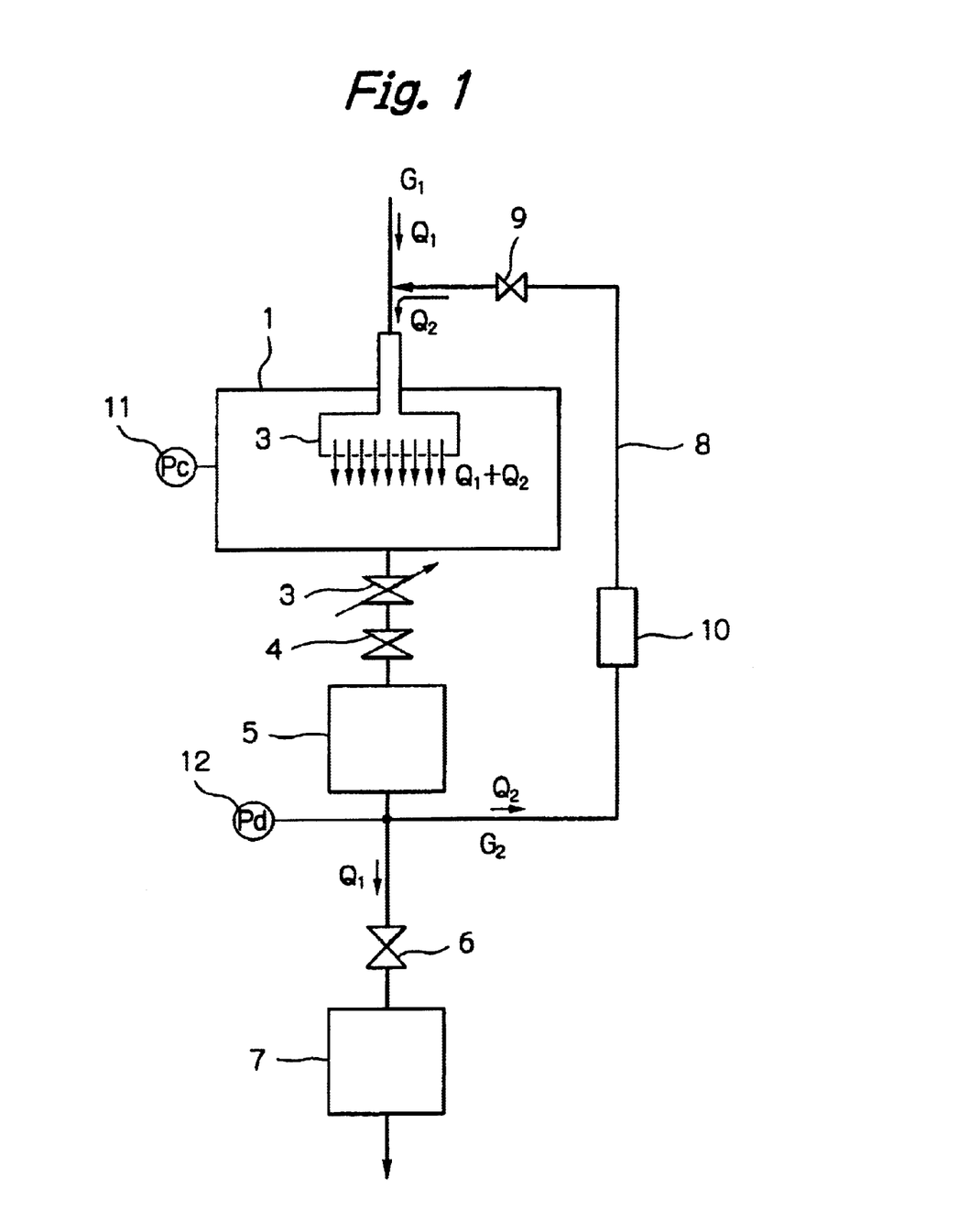
FIG. 1 is a diagram showing a structural example of an evacuation system in which a conventional gas recirculation flow control method is carried out.

FIG. 1 is a diagram showing a structural example of an evacuation system in which the flow rate of a recirculating gas is controlled by directly measuring the recirculating gas flow rate using a mass flow controller as stated above. The evacuation system includes a vacuum chamber 1 into which a gas is introduced. The vacuum chamber 1 has a shower head 2. The evacuation system further includes an adaptive pressure control valve 3, a first vacuum pump suction-side gate valve 4, a first vacuum pump 5, a second vacuum pump suction-side gate valve 6, a second vacuum pump 7, a gas recirculation line 8, a gas recirculation line gate valve (on-off valve) 9, a mass flow controller 10, a first pressure sensor 11 for detecting the pressure in the vacuum chamber 1, and a second pressure sensor 12 for detecting the pressure in the upstream side of the gas recirculation line 8.

In the evacuation system having the above-described arrangement, a gas $G_1$ is introduced into the vacuum chamber 1 through the shower head 2 at a flow rate $Q_1$. The introduced gas is exhausted by the first vacuum pump 5 to reduce the pressure in the vacuum chamber 1 to a desired pressure. The first vacuum pump 5 is evacuated by the second vacuum pump 7 to lower the back pressure of the first vacuum pump 5 below an allowable back pressure. A part of gas $G_2$ exhausted from the first vacuum pump 5 is returned to the vacuum chamber 1 through the gas recirculation line 8. The recirculation flow rate $Q_2$ of gas returned to the vacuum chamber 1 is measured by the mass flow controller 10 provided in the gas recirculation line 8 and is controlled by varying the effective pumping speeds of the first vacuum pump 5 and the second vacuum pump 7, etc. on the basis of the measured flow rate $Q_2$.

In the above-described gas recirculation flow control method, the flow rate of the recirculating gas $G_2$ is measured directly with a mass flow controller. This method needs a differential pressure of more than about 50 kPa for the operation of the mass flow controller. In some evacuation systems, however, the differential pressure in the gas recirculation line 8 is not more than 50 kPa. Accordingly, a mass flow controller cannot be used to control the flow rate of the recirculating gas, depending upon the type of evacuation system to which the control method is applied.

SUMMARY OF THE INVENTION

The present invention was made in view of the above-described circumstances.

An object of the present invention is to provide a gas recirculation flow control method and apparatus for use in an evacuation system, which are simple in arrangement and capable of readily controlling the recirculation flow rate of a gas returning to a vacuum chamber through a gas recirculation line even when the differential pressure in the gas recirculation line is not greater than the working pressure of a mass flow controller used (i.e. not more than 50 kPa).

According to a first aspect of the present invention, there is provided a gas recirculation flow control method for use in an evacuation system having a vacuum chamber into which a gas is introduced. The evacuation system further has a first vacuum pump for exhausting the gas from the vacuum chamber and reducing the pressure in the vacuum chamber to a desired pressure, a second vacuum pump for performing evacuation to lower the back pressure of the first vacuum pump below an allowable back pressure, and a gas recirculation line for returning a part of gas exhausted from the first vacuum pump to the vacuum chamber. According to the present invention, the recirculation flow rate $Q_2$ of the gas returning to the vacuum chamber through the gas recirculation line is controlled by adjusting the differential pressure Pd−Pc in the gas recirculation line by varying the effective pumping speed of the second vacuum pump using the following formula:

$$Q_2 = C \times (Pd - Pc)$$

where: $Q_2$ denotes the recirculation flow rate of the gas returning to the vacuum chamber through the gas recirculation line; Pc denotes the pressure in the vacuum chamber; Pd denotes the pressure in the upstream side of the gas recirculation line; and C denotes the conductance of the gas recirculation line.

By adopting the above-described arrangement in the gas recirculation flow control method for the evacuation system, the gas recirculation flow rate $Q_2$ can be controlled simply by adjusting the differential pressure Pd−Pc in the gas recirculation line by varying the effective pumping speed of the second vacuum pump.

According to a second aspect of the present invention, there is provided a gas recirculation flow control method for use in an evacuation system having a vacuum chamber into which a gas is introduced. The evacuation system further has a first vacuum pump for exhausting the gas from the vacuum chamber and reducing the pressure in the vacuum chamber to a desired pressure, a second vacuum pump for performing evacuation to lower the back pressure of the first vacuum pump below an allowable back pressure, and a gas recirculation line for returning a part of gas exhausted from the first vacuum pump to the vacuum chamber. According to the present invention, the recirculation flow rate $Q_2$ of the gas returning to the vacuum chamber through the gas recirculation line is controlled by adjusting the diferential pressure Pd−Pc in the gas recirculation line by varying the flow rate of a purge gas introduced upstream or inside the second vacuum pump, which consists of at least one substance used as a component of the gas introduced into the vacuum chamber, by using the following formula:

$$Q_2 = C \times (Pd - Pc)$$

where: $Q_2$ denotes the recirculation flow rate of the gas returning to the vacuum chamber through the gas recirculation line; Pc denotes the pressure in the vacuum chamber; Pd denotes the pressure in the upstream side of the gas recirculation line; and C denotes the conductance of the gas recirculation line.

By adopting the above-described arrangement in the gas recirculation flow control method for the evacuation system, the gas recirculation flow rate $Q_2$ can be controlled simply by adjusting the differential pressure Pd−Pc in the gas recirculation line by varying the flow rate of the purge gas introduced upstream or inside the second vacuum pump.

According to a third aspect of the present invention, there is provided a gas recirculation flow control method for use in an evacuation system having a vacuum chamber into which a gas is introduced. The evacuation system further has a first vacuum pump for exhausting the gas from the vacuum chamber and reducing the pressure in the vacuum chamber to a desired pressure, a second vacuum pump for performing evacuation to lower the back pressure of the first vacuum pump below an allowable back pressure, and a gas recirculation line for returning a part of gas exhausted from the first vacuum pump to the vacuum chamber. According to the present invention, the recirculation flow rate $Q_2$ of the gas returning to the vacuum chamber through the gas recirculation line is controlled according to a control procedure including the following steps ① to ③: ① introducing, in a non-recirculating state, the gas into the vacuum chamber at an arbitrary flow rate Qt, and adjusting and fixing the effective pumping speed of the first vacuum pump to an appropriate level to make the pressure Pc in the vacuum chamber equal to a desired pressure $P_1$; ② changing the flow rate of the gas introduced into the vacuum chamber to $Q_1 = Qt \times (100-A)/100$, which corresponds to an arbitrary recirculation ratio A $\{A=(Q_2/Qt \times 100)\}\%$, while fixing the effective pumping speed of the first vacuum pump at the same level as in the step ①; and ③ opening the gas recirculation line, and in the gas recirculating state, adjusting the effective pumping speed of the second vacuum pump so that the pressure Pc in the vacuum chamber becomes equal to the pressure $P_1$ obtained at the step ①.

By adopting the above-described arrangement in the gas recirculation flow control method for the evacuation system, the gas recirculation flow rate $Q_2$ can be controlled simply by introducing the gas at the total flow rate Qt, adjusting the effective pumping speed of the first vacuum pump, adjusting the flow rate of the introduced gas, and adjusting the effective pumping speed of the second vacuum pump.

According to a fourth aspect of the present invention, there is provided a gas recirculation flow control method for use in an evacuation system having a vacuum chamber into which a gas is introduced. The evacuation system further has a first vacuum pump for exhausting the gas from the vacuum chamber and reducing the pressure in the vacuum chamber to a desired pressure, a second vacuum pump for performing evacuation to lower the back pressure of the first vacuum pump below an allowable back pressure, and a gas recirculation line for returning a part of gas exhausted from the first vacuum pump to the vacuum chamber. According to the present invention, the recirculation flow rate $Q_2$ of the gas returning to the vacuum chamber through the gas recirculation line is controlled according to a control procedure including the following steps ① to ③: ① introducing, in a non-recirculating state, the gas into the vacuum chamber at an arbitrary flow rate Qt, and adjusting and fixing the effective pumping speed of the first vacuum pump to an appropriate level to make the pressure Pc in the vacuum chamber equal to a desired pressure $P_1$; ② changing the flow rate of the gas introduced into the vacuum chamber to $Q_1 = Qt \times (100-A)/100$, which corresponds to an arbitrary recirculation ratio A $\{A=(Q_2/Qt \times 100)\}\%$, while fixing the effective pumping speed of the first vacuum pump at the same level as in the step ①; and ③ opening the gas recirculation line, and in the gas recirculating state, adjusting the flow rate of a purge gas introduced upstream or inside the second vacuum pump so that the pressure Pc in the vacuum chamber becomes equal to the pressure $P_1$ obtained at the step ①, the purge gas consisting of at least one substance used as a component of the gas introduced into the vacuum chamber.

By adopting the above-described arrangement in the gas recirculation flow control method for the evacuation system, the gas recirculation flow rate $Q_2$ can be controlled simply by introducing the gas at the total flow rate Qt, adjusting the effective pumping speed of the first vacuum pump, and adjusting the flow rate of the purge gas.

In the gas recirculation flow control method according to the first or third aspect of the present invention, the effective pumping speed of the second vacuum pump may be adjusted by a conductance control device provided upstream of the second vacuum pump.

In the gas recirculation flow control method according to the first or third aspect of the present invention, the effective pumping speed of the second vacuum pump may be adjusted by varying the number of revolutions of the second vacuum pump.

In addition, the present invention provides a gas recirculation flow control apparatus for use in an evacuation system having a vacuum chamber into which a gas is introduced. The evacuation system further has a first vacuum pump for exhausting the gas from the vacuum chamber and reducing the pressure in the vacuum chamber to a desired pressure, a second vacuum pump for performing evacuation to lower the back pressure of the first vacuum pump below an allowable back pressure, a gas recirculation line for returning a part of gas exhausted from the first vacuum pump to the vacuum chamber, a first pressure sensor for detecting the pressure in the vacuum chamber, and a second pressure sensor for detecting the pressure in the upstream side of the gas recirculation line. The gas recirculation flow control apparatus includes a gas recirculation flow control device for controlling the recirculation flow rate $Q_2$ of the gas returning to the vacuum chamber through the gas recirculation line by adjusting the differential pressure Pd−Pc in the gas recirculation line by varying the effective pumping speed of the second vacuum pump using the following formula:

$$Q_2 = C \times (Pd - Pc)$$

where: $Q_2$ denotes the recirculation flow rate of the gas returning to the vacuum chamber through the gas recirculation line; Pc denotes the pressure detected with the first pressure sensor; Pd denotes the pressure detected with the second pressure sensor: and C denotes the conductance of the gas recirculation line.

By adopting the above-described arrangement in the gas recirculation flow control apparatus for the evacuation system, the gas recirculation flow control device can control the gas recirculation flow rate $Q_2$ simply by adjusting the differential pressure Pd−Pc in the gas recirculation line, which is detected with the first and second pressure sensors, by varying the effective pumping speed of the second vacuum pump.

In addition, the present invention provides a gas recirculation flow control apparatus for use in an evacuation system having a vacuum chamber into which a gas is introduced. The evacuation system further has a first vacuum pump for exhausting the gas from the vacuum chamber and reducing the pressure in the vacuum chamber to a desired pressure, a second vacuum pump for performing evacuation to lower the back pressure of the first vacuum pump below an allowable back pressure, a gas recirculation line for returning a part of gas exhausted from the first vacuum pump to the vacuum chamber, a first pressure sensor for detecting the pressure in the vacuum chamber, and a second pressure sensor for detecting the pressure in the upstream side of the gas recirculation line. The gas recirculation flow control apparatus includes a gas recirculation flow control device for controlling the recirculation flow rate $Q_2$ of the gas returning to the vacuum chamber through the gas recirculation line by adjusting the differential pressure Pd−Pc in the gas recirculation line by varying the flow rate of a purge gas introduced upstream or inside the second vacuum pump, the purge gas consisting of at least one substance used as a component of the gas introduced into the vacuum chamber, by using the following formula:

$$Q_2 = C \times (Pd-Pc)$$

where: $Q_2$ denotes the recirculation flow rate of the gas returning to the vacuum chamber through the gas recirculation line; Pc denotes the pressure in the vacuum chamber; Pd denotes the pressure in the upstream side of the gas recirculation line; and C denotes the conductance of the gas recirculation line.

By adopting the above-described arrangement in the gas recirculation flow control apparatus for the evacuation system, the gas recirculation flow control device can control the gas recirculation flow rate $Q_2$ simply by adjusting the differential pressure Pd−Pc in the gas recirculation line, which is detected with the first and second pressure sensors, by varying the purge gas flow rate.

In addition, the present invention provides a gas recirculation flow control apparatus for use in an evacuation system having a vacuum chamber into which a gas is introduced. The evacuation system further has a first vacuum pump for exhausting the gas from the vacuum chamber and reducing the pressure in the vacuum chamber to a desired pressure, a second vacuum pump for performing evacuation to lower the back pressure of the first vacuum pump below an allowable back pressure, a gas recirculation line for returning a part of gas exhausted from the first vacuum pump to the vacuum chamber, a first pressure sensor for detecting the pressure in the vacuum chamber, a second pressure sensor for detecting the pressure in the upstream side of the gas recirculation line, and an on-off valve for selectively opening and closing the gas recirculation line. The gas recirculation flow control apparatus includes a gas recirculation flow control device for controlling the recirculation flow rate $Q_2$ of the gas returning to the vacuum chamber through the gas recirculation line by ① closing the on-off valve and introducing the gas into the vacuum chamber at an arbitrary flow rate Qt, adjusting the effective pumping speed V of the first vacuum pump and fixing it to $V_1$ to make the pressure Pc detected with the first pressure sensor equal to a desired pressure $P_1$, ② and changing the flow rate of the gas introduced into the vacuum chamber to $Q_1 = Qt \times (100-A)/100$, which corresponds to an arbitrary recirculation ratio A $\{A=(Q_2/Qt \times 100)\}\%$, while fixing the effective pumping speed V of the first vacuum pump at $V_1$, ③ and then opening the on-off valve and adjusting the effective pumping speed of the second vacuum pump so that the pressure Pc detected with the first pressure sensor becomes equal to the pressure $P_1$.

By adopting the above-described arrangement in the gas recirculation flow control apparatus for the evacuation system, the gas recirculation flow control device can control the gas recirculation flow rate $Q_2$ simply by on-off controlling the on-off valve, monitoring the pressure detected with the first pressure sensor, adjusting the flow rate of the gas introduced into the vacuum chamber, and adjusting the effective pumping speeds of the first and second vacuum pumps.

In addition, the present invention provides a gas recirculation flow control apparatus for use in an evacuation system having a vacuum chamber into which a gas is introduced. The evacuation system further has a first vacuum pump for exhausting the gas from the vacuum chamber and reducing the pressure in the vacuum chamber to a desired pressure, a second vacuum pump for performing evacuation to lower the back pressure of the first vacuum pump below an allowable back pressure, a gas recirculation line for returning a part of gas exhausted from the first vacuum pump to the vacuum chamber, a first pressure sensor for detecting the pressure in the vacuum chamber, a second pressure sensor for detecting the pressure in the upstream side of the gas recirculation line, and an on-off valve for selectively opening and closing the gas recirculation line. The gas recirculation flow control apparatus includes a gas recirculation flow control device for controlling the recirculation flow rate $Q_2$ of the gas returning to the vacuum chamber through the gas recirculation line by ① closing the on-off valve and introducing the gas into the vacuum chamber at an arbitrary flow rate Qt, adjusting the effective pumping speed V of the first vacuum pump and fixing it to $V_1$ to make the pressure Pc detected with the first pressure sensor equal to a desired pressure $P_1$, ② and changing the flow rate of the gas introduced into the vacuum chamber to $Q_1 = Qt \times (100-A)/100$, which corresponds to an arbitrary recirculation ratio A $\{A=(Q_2/Qt \times 100)\}\%$, while fixing the effective pumping speed V of the first vacuum pump at the $V_1$, ③ and then opening the on-off valve and adjusting the flow rate of a purge gas introduced upstream or inside the second vacuum pump so that the pressure Pc detected with the first pressure sensor becomes equal to the pressure $P_1$, the purge gas consisting of at least one substance used as a component of the gas introduced into the vacuum chamber.

By adopting the above-described arrangement in the gas recirculation flow control apparatus for the evacuation system, the gas recirculation flow control device can control the gas recirculation flow rate $Q_2$ simply by on-off controlling the on-off valve, monitoring the pressure detected with the first pressure sensor, adjusting the flow rate of the gas introduced into the vacuum chamber, adjusting the effective pumping speed of the first vacuum pump, and adjusting the purge gas flow rate.

In any of the above-described gas recirculation flow control apparatus, the gas recirculation flow control device preferably has the function of automatically performing an operation for controlling the recirculation flow rate of the gas.

The above and other objects, features and advantages of the present invention will become more apparent from the following description of the preferred embodiments thereof, taken in conjunction with the accompanying drawings.

DESCRIPTION OF THE PREFERRED EMBODIMENTS

Figure 2:
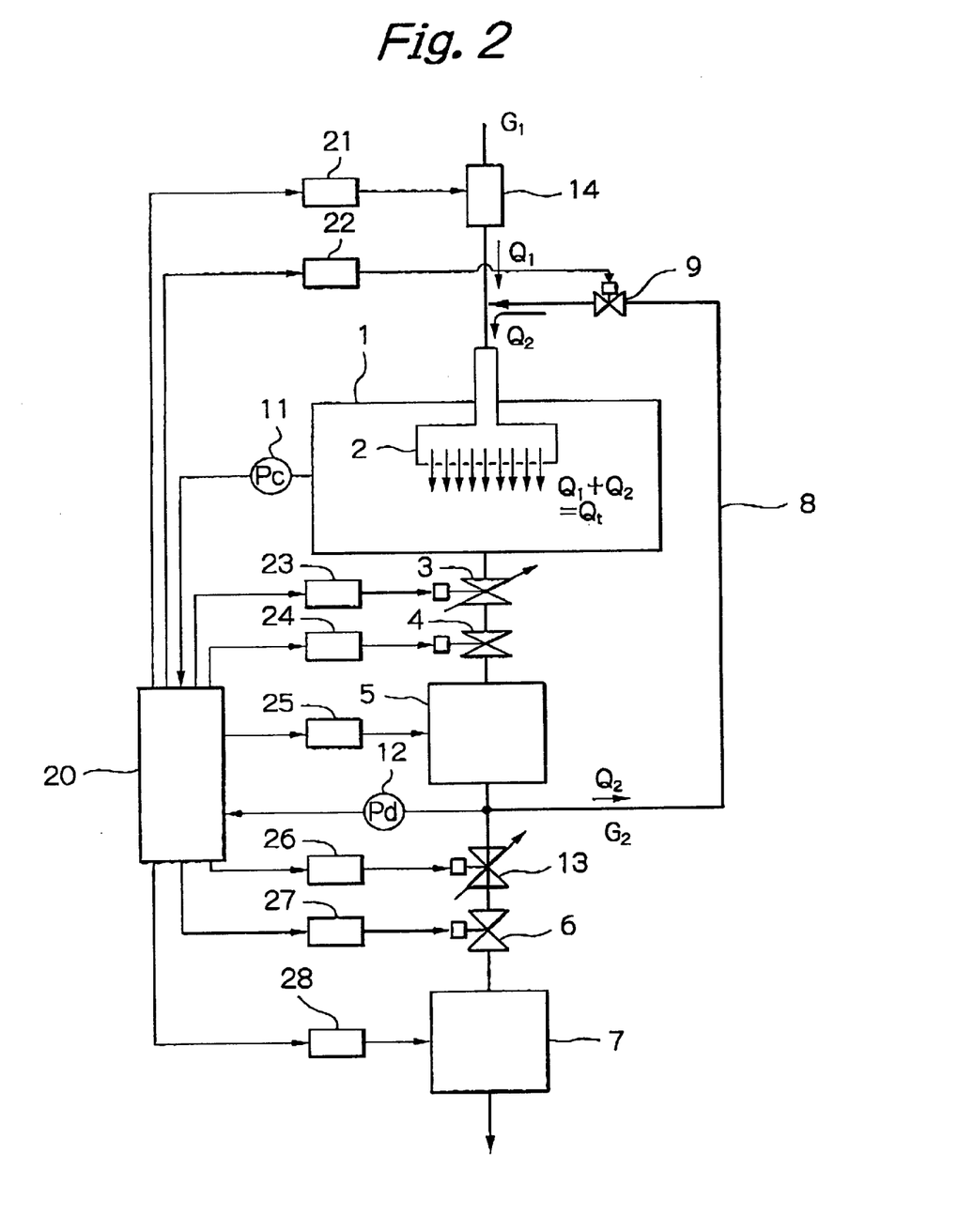
FIG. 2 is a diagram showing a structural example of an evacuation system having a gas recirculation flow control apparatus according to the present invention.

Embodiments of the present invention will be described below in detail with reference to the accompanying drawings. FIG. 2 is a diagram showing an arrangement of an evacuation system having a gas recirculation flow control apparatus according to the present invention. In FIG. 2, portions denoted by the same reference symbols as those in FIG. 1 are the same or corresponding portions. Therefore, a description thereof is omitted. Reference numeral 13 denotes a conductance controller provided upstream of the second vacuum pump 7. Reference numeral 14 denotes a mass flow controller for controlling the flow rate of the gas to be introduced into the shower head 2.

A gas recirculation flow control device 20 controls the flow rate of the recirculating gas returning to the vacuum chamber 1 through the gas recirculation line 8. The gas recirculation flow control device 20 is supplied with output signals from the first pressure sensor 11 and the second pressure sensor 12. The gas recirculation flow control device 20 controls the mass flow controller 14, the gas recirculation line gate valve 9, the adaptive pressure control valve 3, the first vacuum pump suction-side gate valve 4, the first vacuum pump 5, the conductance controller 13, the second vacuum pump suction-side gate valve 6 and the second vacuum pump 7 through respective drivers 21 to 28.

In the evacuation system arranged as shown in FIG. 2, the recirculation flow rate of the gas returning to the vacuum chamber 1 through the gas recirculation line 8 is denoted by $Q_2$. The pressure in the vacuum chamber 1 detected with the first pressure sensor 11 is denoted by Pc. The pressure in the upstream side of the gas recirculation line 8 detected with the second pressure sensor 12 is denoted by Pd. The conductance of the gas recirculation line 8 is denoted by C. The following formula (1) holds between the gas recirculation flow rate $Q_2$ and the differential pressure Pd−Pc in the gas recirculation line 8.

$$Q_2 = C \times (Pd - Pc) \quad (1)$$

The gas recirculation flow control device 20 monitors the pressure Pc detected with the first pressure sensor 11 and the pressure Pd detected with the second pressure sensor 12, and while doing so, varies the effective pumping speed of the second vacuum pump 7 to adjust the differential pressure Pd−Pc, thereby controlling the gas recirculation flow rate $Q_2$.

Next, the procedure of controlling the gas recirculation flow rate $Q_2$ will be explained by way of a specific conditional example.

[Conditional Example]

Gas total flow rate Qt: 1000 sccm Qt=$Q_1$+$Q_2$ ($Q_1$: flow rate of gas externally introduced into the vacuum chamber 1)

Gas recirculation ratio: 80%

(introduced gas flow rate $Q_1$: 200 sccm; [cc/min at 1 atm, 20° C.]

gas recirculation flow rate $Q_2$: 800 sccm)

Process pressure Pc in the vacuum chamber 1: 10 mTorr

Under the above conditions, the gas recirculation flow rate $Q_2$ is controlled according to the following control procedure.

[Control Procedure]

① The first vacuum pump suction-side gate valve 4 and the second vacuum pump suction-side gate valve 6 are opened, and the gas recirculation line gate valve 9 is closed (i.e. non-recirculating state).

② Gas $G_1$ is externally introduced into the shower head 2 through the mass flow controller 14 at a flow rate Q=$Q_1$=Qt=1000 sccm.

③ The opening of the adaptive pressure control valve 3 is adjusted and fixed to a level where the pressure Pc detected with the first pressure sensor 11 becomes equal to 10 mTorr (i.e. the effective pumping speed V of the first vacuum pump 5 is fixed to $V_1$).

④ The mass flow controller 14 is controlled so that the flow rate Q of gas externally introduced into the shower head 2 is changed to Q=$Q_1$=200 sccm. The flow rate $Q_1$=200 sccm is obtained from the gas recirculation ratio 80% according to the following equation:

200 sccm=1000×(100−80)/100 sccm

⑤ The gas recirculation line gate valve 9 is opened (i.e. gas recirculation starts).

⑥ The effective pumping speed of the second vacuum pump 7 is adjusted so that the pressure PC detected with the first pressure sensor 11 becomes equal to 10 mTorr.

⑦ At this time, the pressure Pd=$P_2$ in the upstream side of the gas recirculation line 8 is detected with the second pressure sensor 12.

⑧ The adaptive pressure control valve 3 is released from the fixed opening position, and automatic pressure control is started so as to make the pressure Pc detected with the first pressure sensor 11 equal to 10 mTorr.

Thus, the flow rate $Q_1$ of the gas externally introduced into the shower head 2 is 200 sccm, and the gas recirculation flow rate $Q_2$ is 800 sccm. Hence, a gas recirculation ratio of 80% is attained. The detected pressure $P_2$ in the upstream side of the gas recirculation line 8 and the detected pressure Pc=$P_1$ in the vacuum chamber 1, together with the gas recirculation flow rate $Q_2$, are expressed by the relationship (1) with respect to the conductance C of the gas recirculation line 8. In this case, even if the state where the gas recirculation ratio is 80% is cancelled (changed), it is possible to reproduce the gas recirculation ratio of 80% ($Q_2$=800 sccm) by performing the following reproducing procedure.

[Reproducing Procedure]

① The first vacuum pump suction-side gate valve 4 and the second vacuum pump suction-side gate valve 6, together with the gas recirculation line gate valve 9, are opened.

② The flow rate $Q_1$ of gas $G_1$ to be externally introduced into the shower head 2 through the mass flow controller 14 is set to $Q_1$=200 sccm.

③ The effective pumping speed of the second vacuum pump 7 is adjusted so that the pressure Pd in the upstream side of the gas recirculation line 8 detected with the second pressure sensor 12 becomes equal to $P_2$ obtained at ⑦ in the above-described control procedure.

④ The adaptive pressure control valve 3 is controlled so that the pressure Pc detected with the first pressure sensor 11 becomes equal to 10 mTorr.

The steps ① to ④ of the above-described reproducing procedure may be carried out in the order mentioned. Alternatively, the steps ① to ④ may be carried out simultaneously. It is desirable to carry out the steps ① to ④ in an order that allows the evacuation system concerned to reproduce the desired state in the shortest period of time.

The effective pumping speed of the second vacuum pump 7 can be adjusted by the conductance controller 13 provided upstream of the second vacuum pump 7 (i.e. the gas recirculation flow control method set forth in the appended claim 5). The effective pumping speed of the second vacuum pump 7 can also be adjusted by changing the number of revolutions of the second vacuum pump 7 (i.e. the gas recirculation flow control method set forth in the appended claim 6).

In the above-described embodiment, the gas recirculation flow rate $Q_2$ is controlled by lowering the effective pumping speed of the second vacuum pump 7 and consequently raising the pressure Pd in the upstream side of the gas recirculation line 8 (i.e. the pressure detected with the second pressure sensor 12). Therefore, it is necessary to select a vacuum pump having a sufficiently wide pumping speed range as the second vacuum pump 7.

Figure 3:
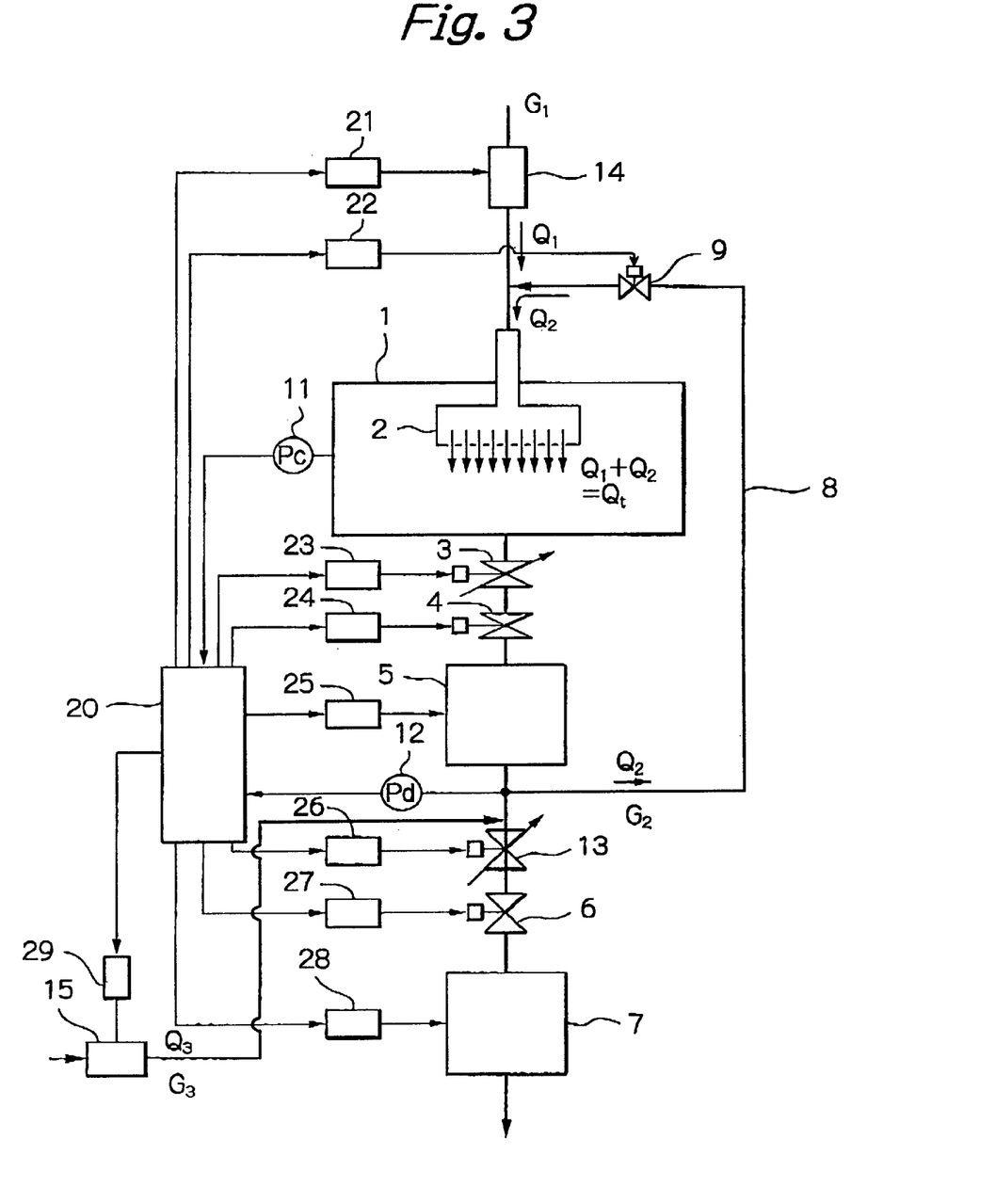
FIG. 3 is a diagram showing another structural example of an evacuation system having a gas recirculation flow control apparatus according to the present invention.

FIG. 3 is a diagram showing another arrangement of an evacuation system having a gas recirculation flow control apparatus according to the present invention. The illustrated evacuation system is arranged such that a purge gas $G_3$ can be supplied between the first vacuum pump 5 and the conductance controller 13 through a mass flow controller 15. The gas recirculation flow rate $Q_2$ is controlled by adjusting a differential pressure Pd−Pc in the gas recirculation line by varying the amount of purge gas $G_3$ supplied (i.e. the gas recirculation flow control method set forth in the appended claim 2). The flow rate $Q_3$ of the purge gas $G_3$ is controlled by the gas recirculation flow control device 20 through a driver 29.

A purge gas inlet is provided upstream or inside the second vacuum pump 7. The purge gas $G_3$ consists of at least one substance used as a component of the gas introduced into the vacuum chamber 1.

In the foregoing embodiments, the gas recirculation flow control method is automatically carried out by the gas recirculation flow control device 20 by way of example. It should be noted, however, that the gas recirculation flow control method may be carried out by a manual operation according to the above-described control procedure.

Further, even if any device is installed in the gas recirculation line 8, it merely constitutes an element determining the conductance of the gas recirculation line 8. Therefore, such an additional device does not exert any influence upon the gas recirculation flow control method according to the present invention.

Figure 4:
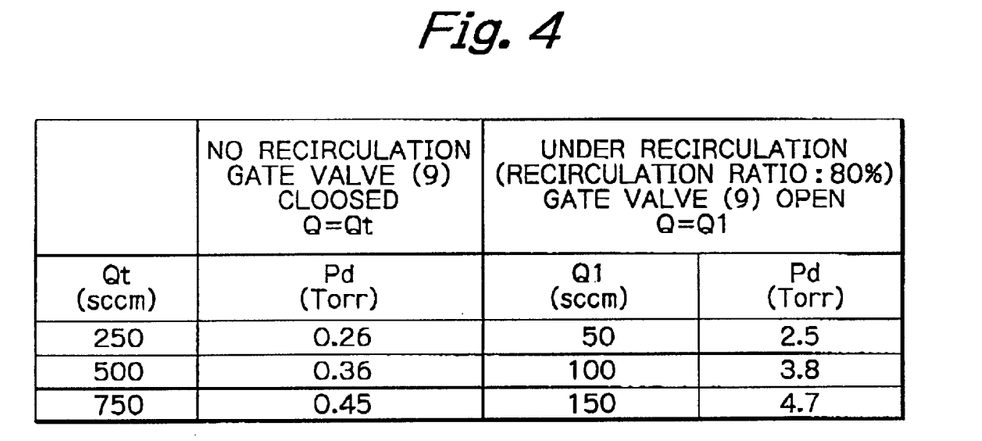
FIG. 4 is a diagram showing an example in which the gas recirculation ratio is adjusted by a gas recirculation flow control method according to the present invention.

FIG. 4 shows an example in which the gas recirculation ratio is adjusted by the above-described control procedure. The system configuration is as follows. The volumetric capacity of the vacuum chamber 1 is 4 L. The pumping speed of the first vacuum pump 5 is 1300 L/sec. The pumping speed of the second vacuum pump 7 is 3000 L/min. The foreline length, i.e. length between an output of the first vacuum pump and an inlet of the second vacuum pump, is 5 m. The foreline inner diameter is 40 mm. The gas recirculation line length is 1.5 m. The gas recirculation line inner diameter is 10 mm. The evacuation conditions are as follow. The kind of gas used is air. The pressure Pc in the vacuum chamber 1 is 50 mTorr (0.05 Torr).

FIG. 4 shows changes of the pressure Pd in the upstream side of the gas recirculation line 8 (i.e. the pressure detected with the second pressure sensor 12) when the total gas flow rate Qt ($Q_1+Q_2$) is changed from 250 sccm through 500 sccm to 750 sccm under two different conditions, i.e. one where the gas recirculation line gate valve 9 is closed (no recirculation), and the other where the gas recirculation line gate valve 9 is open (recirculation ratio: 80%). As illustrated in the figure, the pressure Pd when there is no recirculation changes from 0.26 Torr through 0.36 Torr to 0.45 Torr, whereas the pressure Pd when there is recirculation (recirculation ratio: 80%) changes from 2.5 Torr through 3.8 Torr to 4.7 Torr.

As has been stated above, the present invention provides the following advantageous effects.

According to one aspect of the present invention, the gas recirculation flow rate $Q_2$ can be controlled simply by adjusting the differential pressure Pd−Pc in the gas recirculation line by varying the effective pumping speed of the second vacuum pump or the flow rate of the purge gas introduced upstream or inside the second vacuum pump. Therefore, it is possible to provide a gas recirculation flow control method capable of controlling the gas recirculation flow rate (recirculation ratio) as desired irrespective of the magnitude of the differential pressure in the gas recirculation line in a recirculation process in which a part of exhaust gas is returned to the vacuum chamber to increase the utilization efficiency of the unreacted gas.

According to another aspect of the present invention, the gas recirculation flow control device can control the gas recirculation flow rate $Q_2$ simply by adjusting the differential pressure Pd−Pc in the gas recirculation line, which is detected with the first and second pressure sensors, by varying the effective pumping speed of the second vacuum pump or the flow rate of the purge gas introduced upstream or inside the second vacuum pump. Therefore, it is possible to provide a gas recirculation flow control apparatus capable of controlling the gas recirculation flow rate (recirculation ratio) as desired irrespective of the magnitude of the differential pressure in the gas recirculation line in a recirculation process in which a part of exhaust gas is returned to the vacuum chamber to increase the utilization efficiency of the unreacted gas.

It should be noted that the present invention is not necessarily limited to the foregoing embodiments but can be modified in a variety of ways.

What is claimed is:

1. A gas recirculation flow control method for use in an evacuation system having a vacuum chamber into which a gas is introduced, a first vacuum pump for exhausting said gas from said vacuum chamber and reducing a pressure in said vacuum chamber to a desired pressure, a second vacuum pump for performing evacuation to lower a back pressure of said first vacuum pump below an allowable back pressure, and a gas recirculation line for returning a part of gas exhausted from said first vacuum pump to said vacuum chamber,     wherein a recirculation flow rate $Q_2$ of the gas returning to said vacuum chamber through said gas recirculation line is controlled by adjusting a differential pressure Pd−Pc in said gas recirculation line by varying an effective pumping speed of said second vacuum pump using the following formula:

$$Q_2 = C \times (Pd - Pc)$$

where: $Q_2$ denotes the recirculation flow rate of the gas returning to said vacuum chamber through said gas recirculation line; Pc denotes a pressure in said vacuum chamber; Pd denotes a pressure in an upstream side of said gas recirculation line; and C denotes a conductance of said gas recirculation line.

2. A gas recirculation flow control method for use in an evacuation system having a vacuum chamber into which a gas is introduced, a first vacuum pump for exhausting said gas from said vacuum chamber and reducing a pressure in said vacuum chamber to a desired pressure, a second vacuum pump for performing evacuation to lower a back pressure of said first vacuum pump below an allowable back pressure, and a gas recirculation line for returning a part of gas exhausted from said first vacuum pump to said vacuum chamber, wherein a recirculation flow rate $Q_2$ of the gas returning to said vacuum chamber through said gas recirculation line is controlled by adjusting a differential pressure Pd–Pc in said gas recirculation line by varying a flow rate of a purge gas introduced upstream or inside said second vacuum pump, said purge gas consisting of at least one substance used as a component of the gas introduced into said vacuum chamber, by using the following relationship:

$$Q_2 = C \times (Pd - Pc)$$

where: $Q_2$ denotes the recirculation flow rate of the gas returning to said vacuum chamber through said gas recirculation line; Pc denotes a pressure in said vacuum chamber; Pd denotes a pressure in an upstream side of said gas recirculation line; and C denotes a conductance of said gas recirculation line.

3. A gas recirculation flow control method for use in an evacuation system having a vacuum chamber into which a gas is introduced, a first vacuum pump for exhausting said gas from said vacuum chamber and reducing a pressure in said vacuum chamber to a desired pressure, a second vacuum pump for performing evacuation to lower a back pressure of said first vacuum pump below an allowable back pressure, and a gas recirculation line for returning a part of gas exhausted from said first vacuum pump to said vacuum chamber, wherein a recirculation flow rate $Q_2$ of the gas returning to said vacuum chamber through said gas recirculation line is controlled according to a control procedure including the steps ① to ③:

① introducing, in a non-recirculating state, the gas into said vacuum chamber at an arbitrary flow rate Qt, and adjusting and fixing an effective pumping speed of said first vacuum pump to an level sufficient to make a pressure Pc in said vacuum chamber equal to a desired pressure $P_1$;

② changing the flow rate of the gas introduced into said vacuum chamber to $Q_1 = Qt \times (100-A)/100$, which corresponds to an arbitrary recirculation ratio A $\{A=(Q_2/Qt\times 100)\}\%$, while fixing the effective pumping speed of said first vacuum pump at a same level as in the step ①; and ③ opening said gas recirculation line, and in a gas recirculating state, adjusting an effective pumping speed of said second vacuum pump so that the pressure Pc in said vacuum chamber becomes equal to the pressure $P_1$ obtained at the step ①.

4. A gas recirculation flow control method for use in an evacuation system having a vacuum chamber into which a gas is introduced, a first vacuum pump for exhausting said gas from said vacuum chamber and reducing a pressure in said vacuum chamber to a desired pressure, a second vacuum pump for performing evacuation to lower a back pressure of said first vacuum pump below an allowable back pressure, and a gas recirculation line for returning a part of gas exhausted from said first vacuum pump to said vacuum chamber, wherein a recirculation flow rate $Q_2$ of the gas returning to said vacuum chamber through said gas recirculation line is controlled according to a control procedure including the steps ① to ③:

① introducing, in a non-recirculating state, the gas into said vacuum chamber at an arbitrary flow rate Qt, and adjusting and fixing an effective pumping speed of said first vacuum pump to an level sufficient to make a pressure Pc in said vacuum chamber equal to a desired pressure $P_1$;

② changing the flow rate of the gas introduced into said vacuum chamber to $Q_1 = Qt \times (100-A)/100$, which corresponds to an arbitrary recirculation ratio A $\{A=(Q_2/Qt\times 100)\}\%$, while fixing the effective pumping speed of said first vacuum pump at a same level as in the step ①; and ③ opening said gas recirculation line, and in a gas recirculating state, adjusting a flow rate of a purge gas introduced upstream or inside said second vacuum pump so that the pressure Pc in said vacuum chamber becomes equal to the pressure $P_1$ obtained at the step ①, said purge gas consisting of at least one substance used as a component of the gas introduced into said vacuum chamber.

5. A gas recirculation flow control method according to claim 1, wherein the effective pumping speed of said second vacuum pump is adjusted by conductance control means provided upstream of said second vacuum pump.

6. A gas recirculation flow control method according to claim 1 wherein the effective pumping speed of said second vacuum pump is adjusted by varying a number of revolutions of said second vacuum pump.

7. A gas recirculation flow control apparatus for use in an evacuation system having a vacuum chamber into which a gas is introduced, a first vacuum pump for exhausting said gas from said vacuum chamber and reducing a pressure in said vacuum chamber to a desired pressure, a second vacuum pump for performing evacuation to lower a back pressure of said first vacuum pump below an allowable back pressure, a gas recirculation line for returning a part of gas exhausted from said first vacuum pump to said vacuum chamber, a first pressure sensor for detecting the pressure in said vacuum chamber, and a second pressure sensor for detecting a pressure in an upstream side of said gas recirculation line, said gas recirculation flow control apparatus comprising gas recirculation flow control means for controlling a recirculation flow rate $Q_2$ of the gas returning to said vacuum chamber through said gas recirculation line by adjusting a differential pressure Pd–Pc in said gas recirculation line by varying an effective pumping speed of said second vacuum pump using the following relationship:

$$Q_2 = C \times (Pd - Pc)$$

where: $Q_2$ denotes the recirculation flow rate of the gas returning to said vacuum chamber through said gas recirculation line; Pc denotes a pressure detected with said first pressure sensor; Pd denotes a pressure detected with said second pressure sensor; and C denotes a conductance of said gas recirculation line.

8. A gas recirculation flow control apparatus for use in an evacuation system having a vacuum chamber into which a gas is introduced, a first vacuum pump for exhausting said gas from said vacuum chamber and reducing a pressure in said vacuum chamber to a desired pressure, a second vacuum pump for performing evacuation to lower a back pressure of said first vacuum pump below an allowable back pressure, a gas recirculation line for returning a part of gas exhausted from said first vacuum pump to said vacuum chamber, a first pressure sensor for detecting the pressure in said vacuum chamber, and a second pressure sensor for detecting a pressure in an upstream side of said gas recirculation line, said gas recirculation flow control apparatus comprising gas recirculation flow control means for controlling a recirculation flow rate $Q_2$ of the gas returning to said vacuum chamber through said gas recirculation line by adjusting a differential pressure Pd–Pc in said gas recirculation line by varying a flow rate of a purge gas introduced upstream or inside said second vacuum pump, said purge gas consisting of at least one substance used as a component of the gas introduced into said vacuum chamber, by using the following relationship:

$$Q_2 = C \times (Pd - Pc)$$

where: $Q_2$ denotes the recirculation flow rate of the gas returning to said vacuum chamber through said gas recirculation line; Pc denotes a pressure in said vacuum chamber; Pd denotes a pressure in an upstream side of said gas recirculation line; and C denotes a conductance of said gas recirculation line.

9. A gas recirculation flow control apparatus for use in an evacuation system having a vacuum chamber into which a gas is introduced, a first vacuum pump for exhausting said gas from said vacuum chamber and reducing a pressure in said vacuum chamber to a desired pressure, a second vacuum pump for performing evacuation to lower a back pressure of said first vacuum pump below an allowable back pressure, a gas recirculation line for returning a part of gas exhausted from said first vacuum pump to said vacuum chamber, a first pressure sensor for detecting the pressure in said vacuum chamber, a second pressure sensor for detecting a pressure in an upstream side of said gas recirculation line, and an on-off valve for selectively opening and closing said gas recirculation line, said gas recirculation flow control apparatus comprising gas recirculation flow control means for controlling a recirculation flow rate $Q_2$ of the gas returning to said vacuum chamber through said gas recirculation line by ① closing said on-off valve and introducing the gas into said vacuum chamber at an arbitrary flow rate Qt, adjusting an effective pumping speed V of said first vacuum pump and fixing it to $V_1$ to make a pressure Pc detected with said first pressure sensor equal to a desired pressure $P_1$, ② and changing the flow rate of the gas introduced into said vacuum chamber to $Q_1 = Qt \times (100-A)/100$, which corresponds to an arbitrary recirculation ratio A $\{A=(Q_2/Qt \times 100)\}\%$, while fixing the effective pumping speed V of said first vacuum pump at said $V_1$, ③ and then opening said on-off valve and adjusting an effective pumping speed of said second vacuum pump so that the pressure Pc detected with said first pressure sensor becomes equal to said pressure $P_1$.

10. A gas recirculation flow control apparatus for use in an evacuation system having a vacuum chamber into which a gas is introduced, a first vacuum pump for exhausting said gas from said vacuum chamber and reducing a pressure in said vacuum chamber to a desired pressure, a second vacuum pump for performing evacuation to lower a back pressure of said first vacuum pump below an allowable back pressure, a gas recirculation line for returning a part of gas exhausted from said first vacuum pump to said vacuum chamber, a first pressure sensor for detecting the pressure in said vacuum chamber, a second pressure sensor for detecting a pressure in an upstream side of said gas recirculation line, and an on-off valve for selectively opening and closing said gas recirculation line, said gas recirculation flow control apparatus comprising gas recirculation flow control means for controlling a recirculation flow rate $Q_2$ of the gas returning to said vacuum chamber through said gas recirculation line by ① closing said on-off valve and introducing the gas into said vacuum chamber at an arbitrary flow rate Qt, adjusting an effective pumping speed V of said first vacuum pump and fixing it to $V_1$ to make a pressure Pc detected with said first pressure sensor equal to a desired pressure $P_1$, ② and changing the flow rate of the gas introduced into said vacuum chamber to $Q_1 = Qt \times (100-A)/100$, which corresponds to an arbitrary recirculation ratio A $\{A=(Q_2/Qt \times 100)\}\%$, while fixing the effective pumping speed V of said first vacuum pump at said $V_1$, ③ and then opening said on-off valve and adjusting a flow rate of a purge gas introduced upstream or inside said second vacuum pump so that the pressure Pc detected with said first pressure sensor becomes equal to said pressure $P_1$, said purge gas consisting of at least one substance used as a component of the gas introduced into said vacuum chamber.

11. A gas recirculation flow control apparatus according to claim 7, wherein said gas recirculation flow control means has a function of automatically performing an operation for controlling the recirculation flow rate of said gas.

12. A gas recirculation flow control method according to claim 3, wherein the effective pumping speed of said second vacuum pump is adjusted by conductance control means provided upstream of said second vacuum pump.

13. A gas recirculation flow control method according to claim 3, wherein the effective pumping speed of said second vacuum pump is adjusted by varying a number of revolutions of said second vacuum pump.

14. A gas recirculation flow control apparatus according to claim 8, wherein said gas recirculation flow control means has a function of automatically performing an operation for controlling the recirculation flow rate of said gas.

15. A gas recirculation flow control apparatus according to claim 9, wherein said gas recirculation flow control means has a function of automatically performing an operation for controlling the recirculation flow rate of said gas.

16. A gas recirculation flow control apparatus according to claim 10, wherein said gas recirculation flow control means has a function of automatically performing an operation for controlling the recirculation flow rate of said gas.

* * * * *